United States Patent [19]

Igarashi et al.

[11] Patent Number: 4,791,607
[45] Date of Patent: Dec. 13, 1988

[54] GATE ARRAY INTEGRATED CIRCUIT DEVICE AND METHOD THEREOF FOR PROVIDING VARIOUS BIT/WORD CONSTRUCTIONS

[75] Inventors: Masato Igarashi, Tokyo; Yoshiyuki Suehiro, Kawasaki, both of Japan

[73] Assignee: Fujitsu limited, Kawasaki, Japan

[21] Appl. No.: 804,489

[22] Filed: Dec. 4, 1985

[30] Foreign Application Priority Data

Dec. 7, 1984 [JP] Japan ................. 59-258594

[51] Int. Cl.⁴ .............................. G11C 5/10
[52] U.S. Cl. ....................... 365/51; 365/63; 365/189
[58] Field of Search ............... 365/63, 51, 72, 189

[56] References Cited

U.S. PATENT DOCUMENTS

| | | | |
|---|---|---|---|
| 4,525,809 | 6/1985 | Chiba et al. | 365/72 |
| 4,527,254 | 7/1985 | Ryan et al. | 365/51 X |
| 4,535,423 | 8/1985 | Nozaki et al. | 365/63 |
| 4,590,588 | 5/1986 | Itoh et al. | 365/51 |
| 4,660,174 | 4/1987 | Takemae et al. | 365/63 |
| 4,688,197 | 8/1987 | Novak et al. | 365/240 |

FOREIGN PATENT DOCUMENTS

| | | |
|---|---|---|
| 0079127 | 5/1983 | European Pat. Off. . |
| 0130798 | 1/1985 | European Pat. Off. ............. 365/72 |
| 3326943 | 2/1984 | Fed. Rep. of Germany ........ 365/72 |
| 54-93375 | 7/1979 | Japan ..................... 365/72 |
| 59-19367 | 1/1984 | Japan ..................... 365/72 |

OTHER PUBLICATIONS

IBM Technical Disclosure Bulletin, "Implementing Array and Logic Functions on a Single Chip", Pomeranz et al., vol. 20, No. 10, Mar. 1978, pp. 3921–3922.
Patent Abstracts of Japan, vol. 8, No. 59, Mar. 17, 1984.
Patent Abstracts of Japan, vol. 6, No. 222, Nov. 6, 1982.

Primary Examiner—Stuart N. Hecker
Assistant Examiner—Alfonso Garcia
Attorney, Agent, or Firm—Staas & Halsey

[57] ABSTRACT

A gate array integrated circuit incorporating memories and a method therefore can realize various bit/word constructions according to customer's requests. The gate array integrated circuit of the present invention provides a basic cell array region in which a plurality of basic cells are arranged, a memory cell matrix region in which a plurality of memory cells are arranged, and a plurality of peripheral circuits which include address input circuits and decoders to access the memory cells.

7 Claims, 21 Drawing Sheets

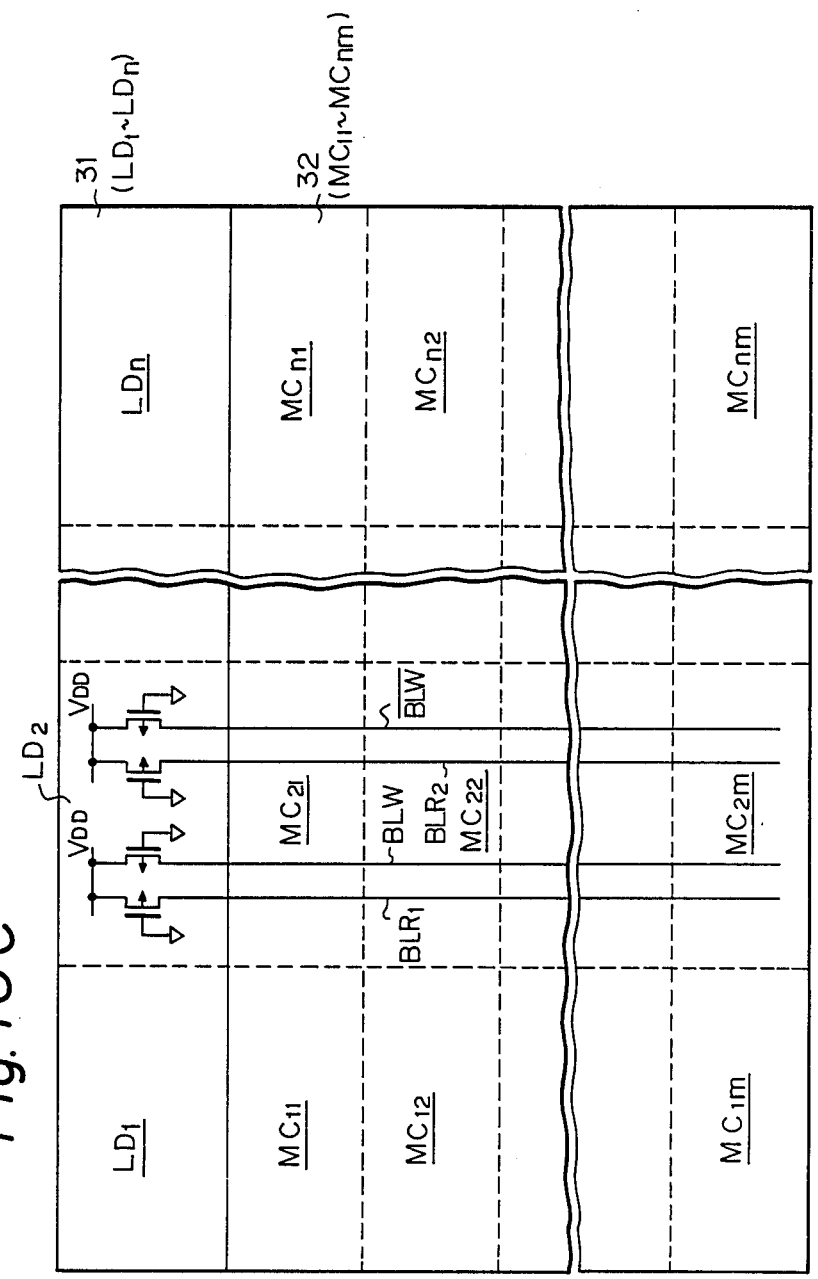

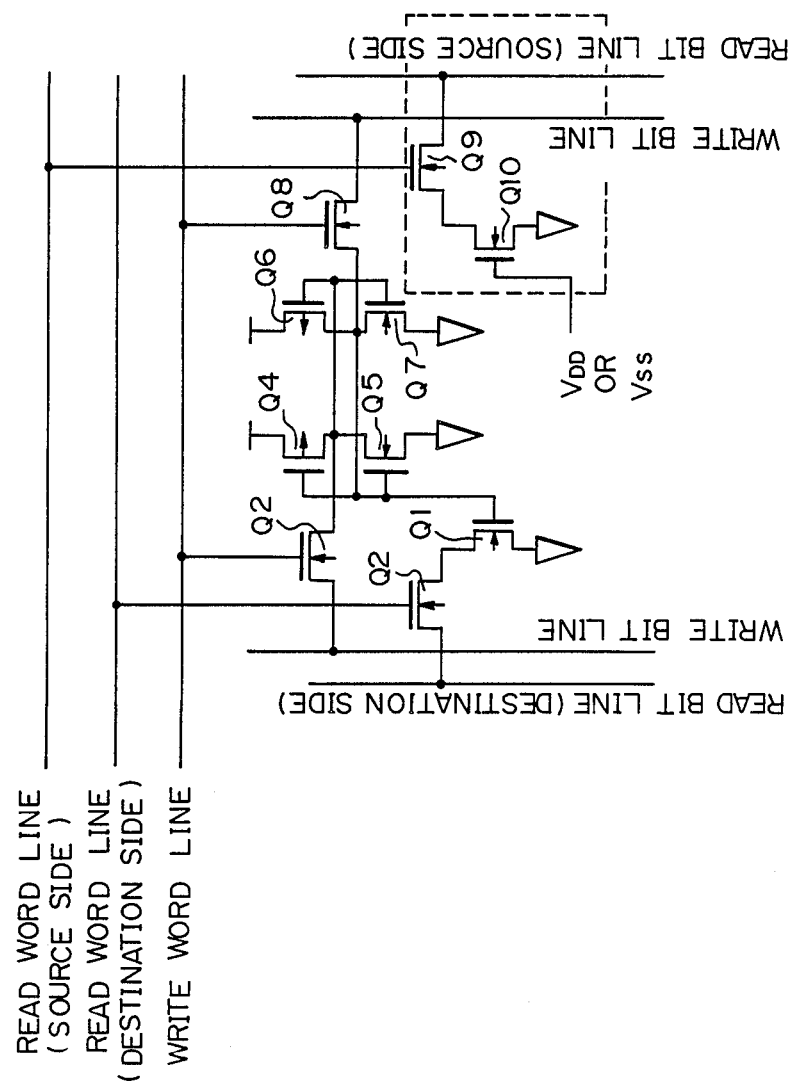

GATE ARRAY INTEGRATED CIRCUIT DEVICE AND METHOD THEREOF FOR PROVIDING VARIOUS BIT/WORD CONSTRUCTIONS

BACKGROUND OF THE INVENTION

1. Field of the Invention

The present invention relates to a gate array integrated circuit device incorporating memories. More particularly, it relates to a gate array integrated circuit device and a method of production which can realize various bit/word constructions according to customer requests.

2. Description of the Related Art

A gate array integrated circuit device is a semicustom LSI comprising a semiconductor chip which is prepared in advance by forming a number of basic cells in an array on the semiconductor chip. These basic cells, such as the basic cells disclosed in Japanese patent application publication No. 54-93375, form a basic unit of a logic circuit. For a semicustom LSI, when a customer requests a certain circuit, only the wiring between the basic cells need be changed, thereby enabling various logic circuit LSIs to be supplied with little delay.

When an arithmetic circuit such as an ALU is prepared from such a gate array integrated circuit device, a memory circuit is needed in addition to the logic circuit. One method of realizing the memory in the gate array integrated circuit includes forming the memory by combining basic cells. However, many basic cells are necessary for forming the memory so that the service efficiency of the basic cells is deteriorated, and the memory area tends to increase.

To cope with the above problem, there has been proposed a gate array integrated circuit device in which a basic cell array and a memory exclusive region are provided together on the same semiconductor chip.

However, it is difficult for the prior art gate array integrated circuit device mentioned above to form a plurality of memories having different bit/word constructions, because the bit/word constructions of a memory cell matrix M of the prior art device is fixed. Supposing a memory cell matrix M of 16 words × 32 bits is prepared in advance. In this case, a memory such as a memory of 16 words × 24 bits, in which a word is less than 32 bits, may be formed without using a part of the memory cell matrix M. However, if a memory of 16 words × 24 bits and a memory of 16 words × 8 bits are required, one of the memories will be formed by using the memory cell matrix M with all the address register AB, word decoder DEC, and clock buffer CB so that the other memory is formed by combining many of the basic cells BC.

As mentioned above, the prior art gate array integrated circuit device cannot completely realize a memory having a bit/word construction satisfying the requirement of a customer, even if a memory exclusive region is provided therewith.

SUMMARY OF THE INVENTION

An object of the present invention is to provide a gate array integrated circuit device in which the integration ratio of the circuit is increased, and effectiveness in circuit designing is improved.

Another object of the present invention is to provide a gate array integrated circuit which realizes a memory having a bit/word construction satisfying a customer's requirement, even if a memory exclusive region is provided therewith.

In order to solve the above-mentioned prior art problems, the present invention provides a gate array integrated circuit device comprising a basic cell array region in which a plurality of basic cells are arranged, a memory cell matrix region in which a plurality of memory cells are arranged, and two pairs of address input circuits and decoders to access the memory cells.

The present invention provides in advance two pairs of address input circuits and decoders on a semiconductor chip to access a memory cell matrix of, for instance, 16 words × 32 bits, which is a conventional type matrix. If a customer requests, for instance, a memory of 24 bits × 16 words and a memory of 8 bits × 16 words, the memories will be formed by dividing the word lines. That is, a group of word lines is formed in which 24 memory cells are connected in a word direction and a group of word lines is formed in which eight memory cells are connected in a word direction, each of the word line groups being connected to the address input circuits and word decoders to realize two independent memories having different bit/word constructions.

BRIEF DESCRIPTION OF THE DRAWINGS

Embodiments of the present invention will be described with reference to the accompanying drawings, in which:

FIGS. 3 and 3A through 3B is a block diagram of a memory portion of FIG. 2;

FIGS. 16A, 16B, and 16C are diagrams of a further embodiment of the present invention;

FIGS. 21A, 21B and 21C are diagrams of patterns corresponding to the circuit shown in FIG. 20.

DESCRIPTION OF THE PREFERRED EMBODIMENTS

Figure 1:
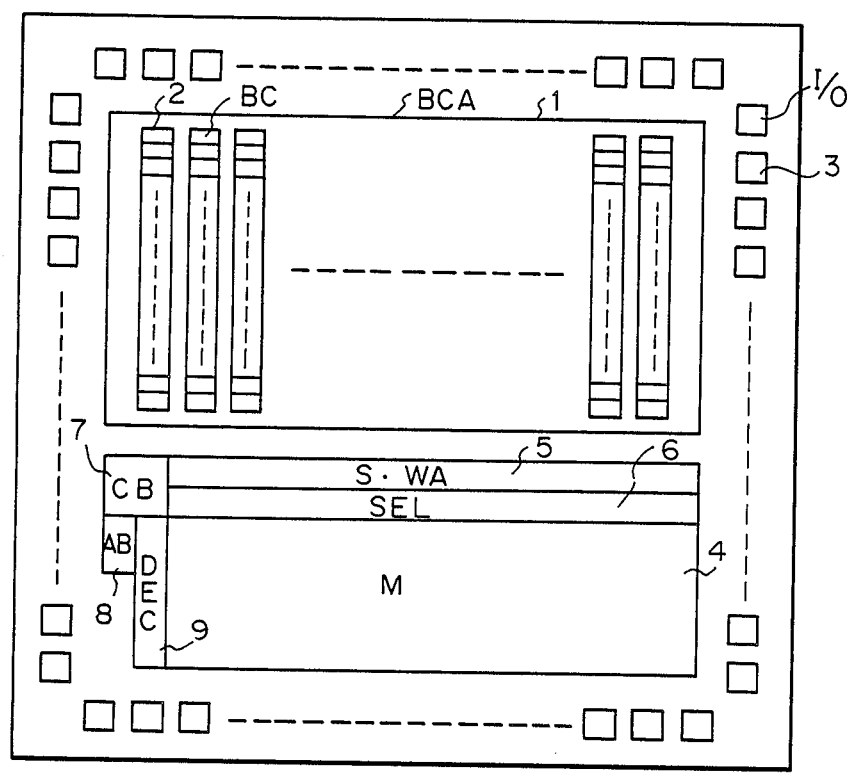
FIG. 1 is a prior art plan view of a gate array integrated circuit device.

FIG. 1 is a layout of a semiconductor chip of a gate array integrated circuit according to the prior art. In the figure, reference numeral 1 represents a basic cell array region (BCA), 2 a basic cell array (BC), 3 an input/output buffer cell (I/O), 4 a memory cell matrix (M), 5 sense and write amplifiers (S.WA), 6 a column selector (SEL), 7 a clock buffer (CB), 8 an address register (AB), and 9 a word decoder (DEC).

In FIG. 1, various logic circuits can be realized by changing a wiring pattern on the basic cells and a wiring pattern between the basic cells. If a memory is required in the logic circuit, the memory matrix M is used for the purpose. Since transistors in that memory cell matrix M are arranged exclusively for providing a memory, a memory having a large capacity is realized within a small area in comparison with the case in which a memory is made by combining the basic cells BC.

However, as already mentioned, it is difficult for the prior art gate array integrated circuit device mentioned above to form a plurality of memories having different bit/word constructions, because the bit/word construction of the memory cell matrix M of the prior art device is fixed.

The first embodiment of the present invention will be explained with reference to the accompanying drawings.

Figure 2:
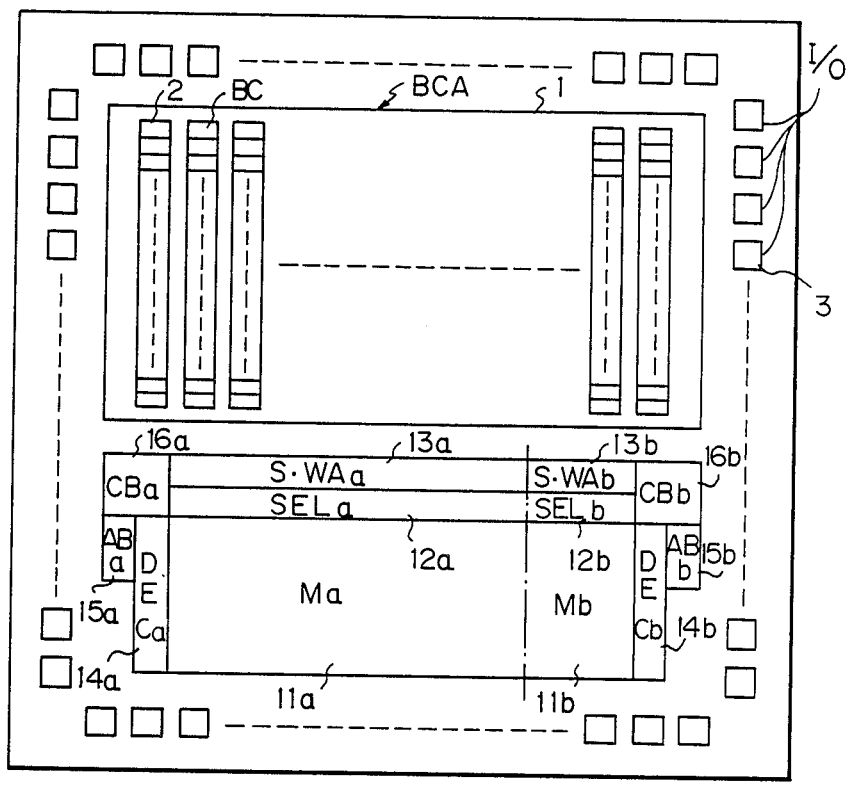
FIG. 2 is a plan view of an embodiment of the present invention.
Figure 3A:
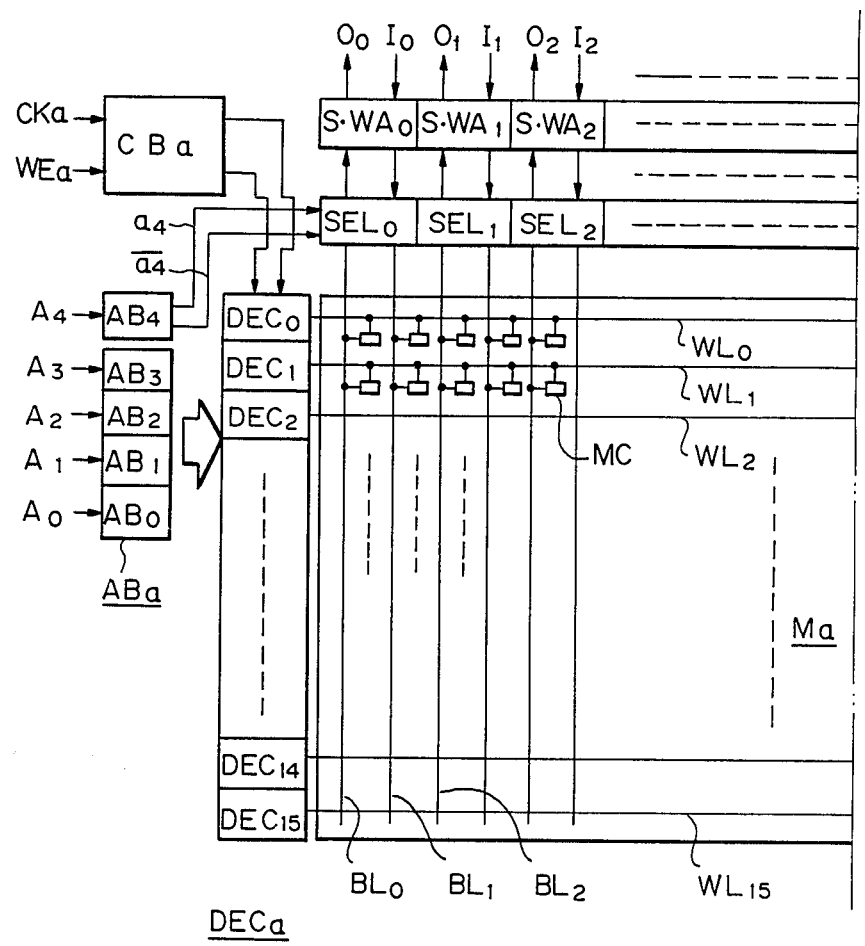
Figure 3B:
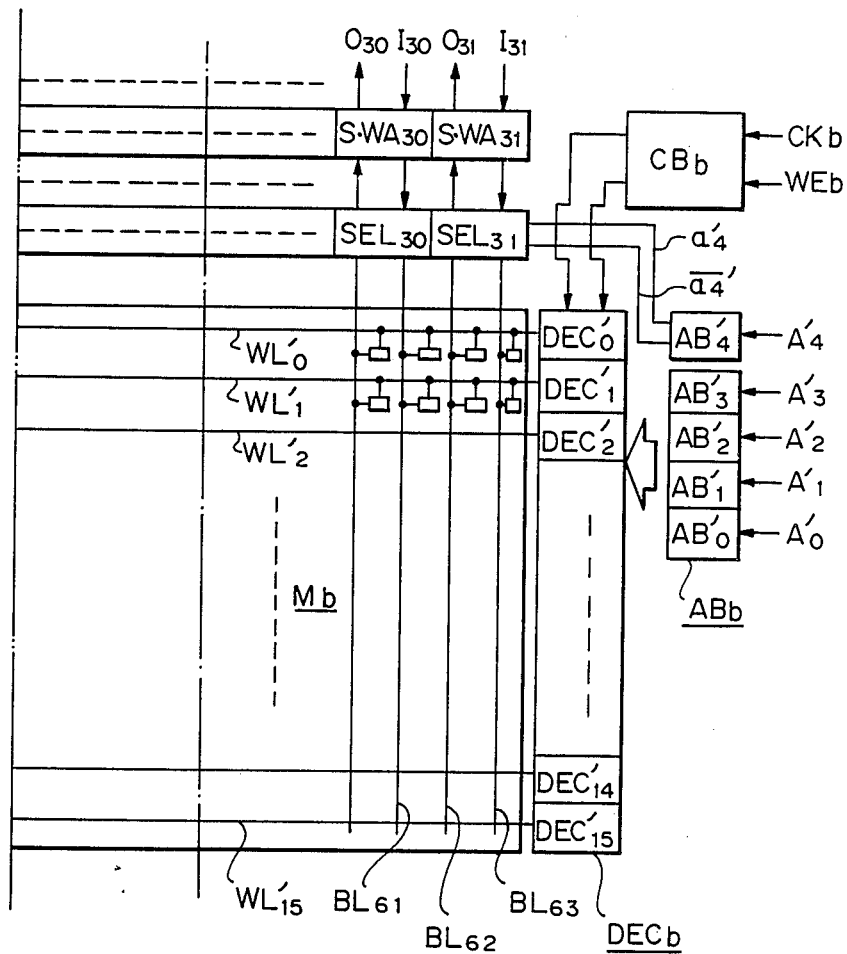

FIG. 2 is a plan view of a gate array integrated circuit device according to an embodiment of the present invention, and FIG. 3 is a block diagram of the construction of a memory portion in the device in FIG. 2. In the figures, "$M_a$" and "$M_b$" (11a and 11b) represent memory cell matrixes, "$SEL_a$" and "$SEL_b$" (12a and 12b) represent column selectors, "$S.WA_a$" and "$S.WA_b$" (13a and 13b) represent sense and write amplifiers, "$DEC_a$" and "$DEC_b$" (14a and 14b) represent word decoders, "$AB_a$" and "$AB_b$" (15a and 15b) represent address registers, "$CB_a$" and "$CB_b$" (16a and 16b) represent clock buffers, "MC" (11) represent a memory cell, "$WL_0$" to "$WL_{15}$" and "$WL'_0$" to "$WL'_{15}$" represent word lines, "$BL_0$" to "$BL_{63}$" represent bit lines, "$CK_a$" and "$CK_b$" represent clock signals, "$WE_a$" and "$WE_b$" represent write enable signals, "$A_0$" to "$A_4$" and "$A'_0$" to "$A'_4$" addresses, "$I_0$" to "$I_{31}$" represent write data, and "$O_0$" to "$O_{31}$" represent read data.

Figure 15:
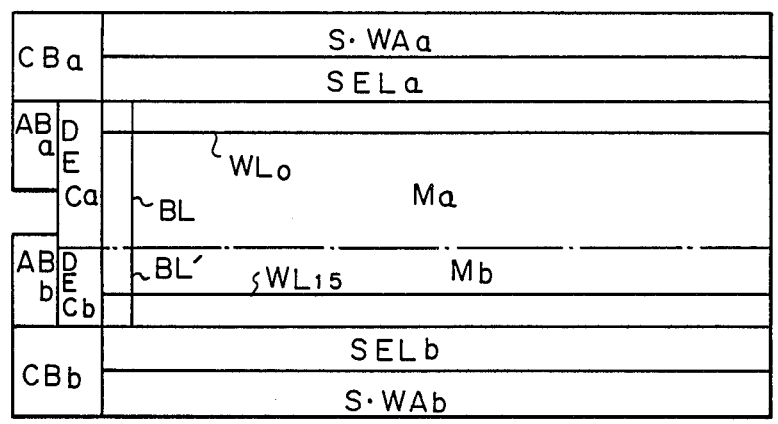
FIG. 15 is a diagram of another embodiment of the present invention.

In the embodiment shown in FIG. 2, the memory cell matrixes $M_a$ and $M_b$ are the same as the memory cell matrix M shown in FIG. 15, the sense and write amplifiers $S.WA_a$ and $S.WA_b$ are the same as the S.WA shown in FIG. 15, and the column selectors $SEL_a$ and $SEL_b$ are the same as the SEL shown in FIG. 1. The present embodiment differs from the prior art in that the present embodiment is provided with two pairs of word decoders and address registers. According to such a construction, word lines in a memory cell matrix can be divided along an alternate long and short dash line shown in FIG. 2, according to a customer's requirement, to form two independent memories each having a different bit/word construction. That is, the memory cell matrix $M_a$ is accessed by a system comprising the elements $AB_a$, $DEC_a$, $CB_a$, $SEL_a$, and $SW_a$, and the memory cell matrix $M_b$ is accessed by a system comprising the elements $AB_b$, $DEC_b$, $CB_b$, $SEL_b$, and $SW_b$. Details of the above will be described with reference to FIG. 3.

In the memory cell matrix shown in FIG. 3, there are arranged memory cells MC having 64×16 pieces. In this case, however, one of two bit lines is selected by a column selector. For instance, the column selector $SEL_0$, which may be regarded as a column decoder, selects the bit line $BL_0$ or $BL_1$ in response to complementary signals $\overline{a_4}$ and $\overline{a_4}$ produced from an address A. Although the memory matrix has a physical construction of 64 bits×16 words in a physical arrangement aspect, it has substantially a construction of 32 bits×32 words. Thus, if the sense and write amplifiers correspond one to one with respect to the bit lines, the column selectors $SEL_0$ to $SEL_{31}$ are not required. Further, the word decoder $DEC_a$ comprises decoders $DEC_0$ to $DEC_{15}$, and the address register $AB_a$ comprises registers $AB_0$ to $AB_4$, so that only $DEC_a$ and $AB_a$ have access to all of the memory matrixes $M_a$ and $M_b$. The elements $DEC_b$ and $AB_b$ are constructed in a similar manner. As a result, the memory cell matrix can be divided at any location.

Since the gate array integrated circuit device is a semicustom LSI produced by a master slice method, a semiconductor chip incorporating elements for realizing the construction shown in FIG. 2 is prepared in advance. According to a customer's request for a circuit, a wiring pattern between basic cells BC is formed. A wiring pattern in a memory is also decided according to the requirement of the customer as is the wiring between the basic cells BC. Supposing a memory of 32 words×24 bits and a memory of 32 words×8 bits are constructed in FIG. 3. In this case, during the formation of a wiring pattern, words lines are divided into a word line group comprising $WL_0$ to $WL_{15}$ and a word line group comprising $WL'_0$ to $WL'_{15}$. The memory of 32 words×24 bits is constructed by connecting the memory cell matrix $M_a$, which includes bit lines $BL_0$ to $BL_{47}$ and word lines $WL_0$ to $WL_{15}$, with the word decoder $DEC_a$, address register $AB_a$, clock buffer $CB_a$, column selectors $SEL_0$ to $SEL_{23}$, and sense and write amplifiers $S.WA_0$ to $S.WA_{23}$. On the other hand, the memory of 32 words×8 bits is constructed by connecting the memory cell matrix $M_b$, which includes bit lines $BL_{48}$ to $BL_{63}$ and word lines $WL'_0$ to $WL'_{15}$, with the word decoder $DEC_b$, address register $AB_b$, clock buffer $CB_a$, column selectors $SEL_{24}$ to $SEL_{31}$, and sense and write amplifiers $S.WA_{24}$ to $S.WA_{31}$.

According to the present invention, not only the example mentioned above but also memories having various bit/word constructions will be made by dividing the memory cell matrix. Such examples are shown in FIGS. 4 to 8. In the figures, like numerals and designations used in FIG. 2 represent like parts.

Figure 4:
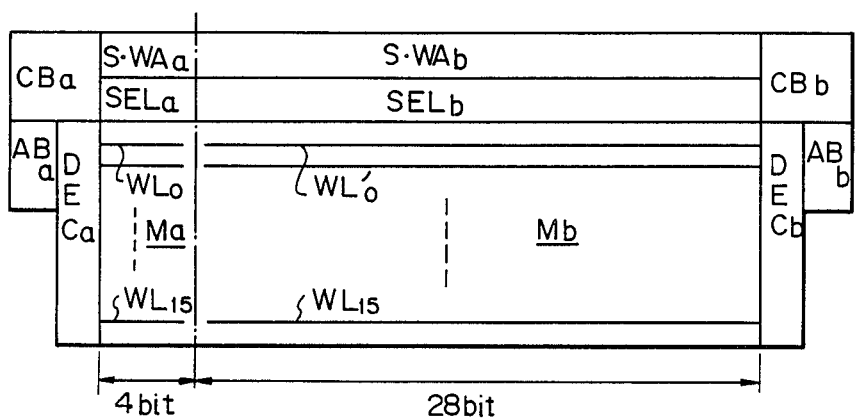
FIGS. 4 through 8 are diagrams of examples of bit/word constructions of memories realized according to the embodiment shown in FIG. 2.

FIG. 4 is an example in which a memory of 32 words×4 bits and a memory of 32 words×28 bits is formed.

Figure 5:
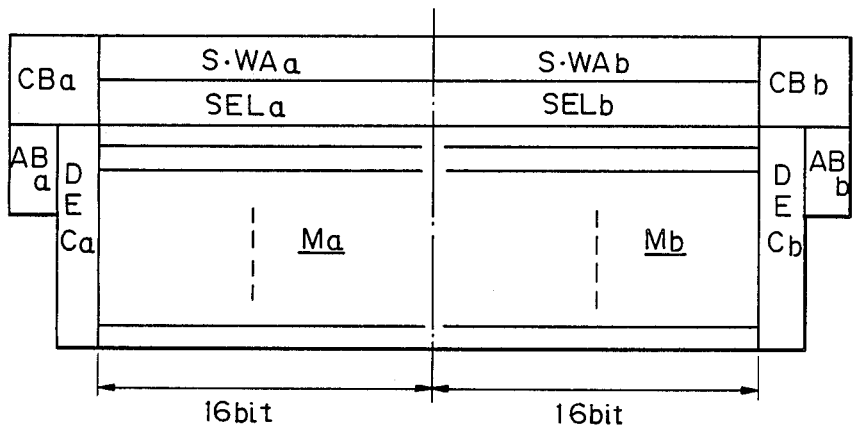

FIG. 5 is an example in which two groups of memories, each comprising 32 words×16 bits, are formed. In this case, addresses other than the most significant bit are input in common to address registers $AB_a$ and $AB_b$, and one of the clock buffers $CB_a$ and $CB_b$ is controlled to be activated according to "1" or "0" of the most significant bit of the address, to realize a memory of 64 words×16 bits.

Figure 6:
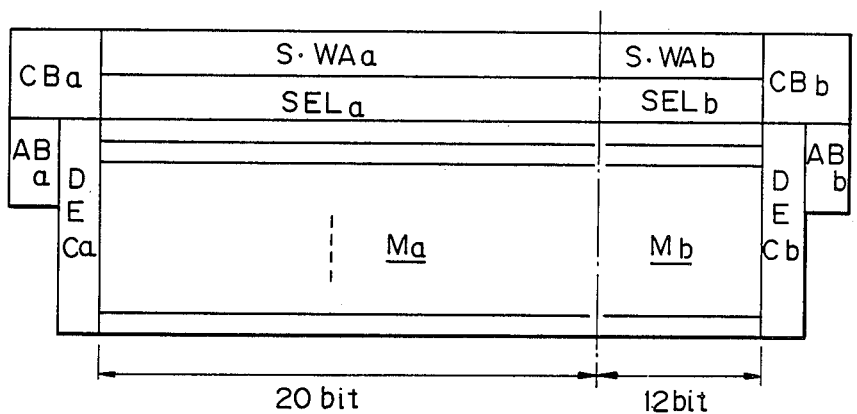

FIG. 6 is an example in which a memory of 20 bits×32 words, and a memory of 32 words×12 bits are formed.

Figure 7:
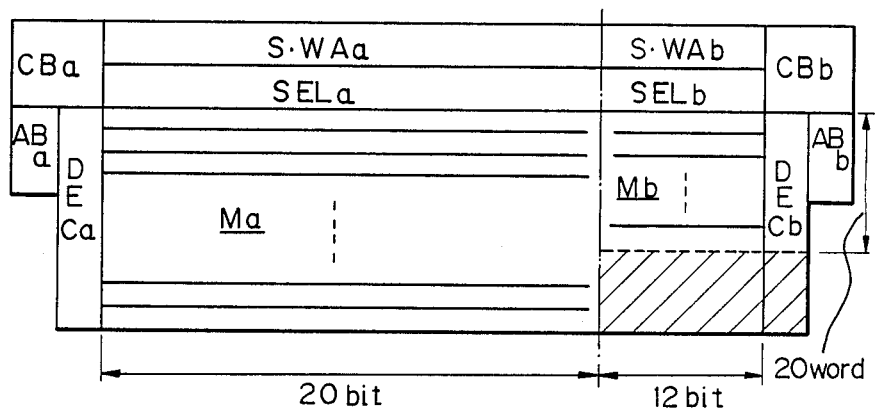

FIG. 7 is an example in which a memory of 32 words×20 bits, and a memory of 20 words×12 bits are formed. In this case, the hatched portion of the memory cell matrix $M_b$ and the related portion of the word decoder $DEC_b$ will not be used.

Figure 8:
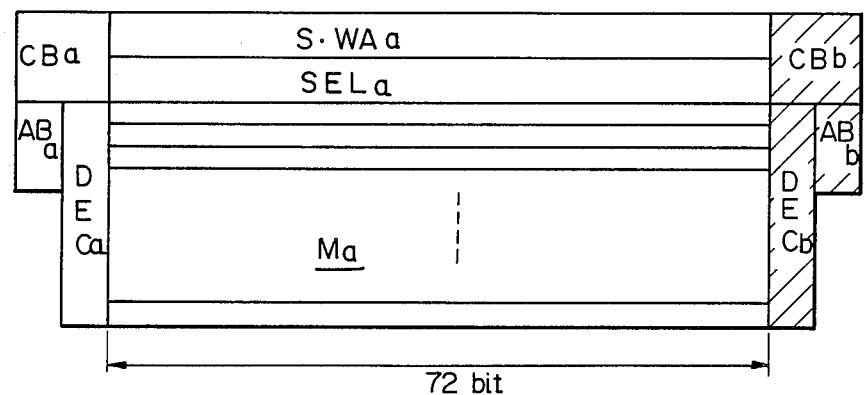

FIG. 8 is an example in which a memory of 32 words×32 bits is formed without using a hatched portion which includes the clock buffer $CB_b$, address register $AB_b$, and word decoder $DEC_b$.

As mentioned above, the present invention provides memories having various bit/word constructions. Since the wiring of gate array integrated circuit device is designed automatically by means of CAD, it is preferred to register wiring patterns of typical bit/word constructions in advance as microcells into the library of the CAD system. For instance, if a basic memory cell matrix is of a 32 words×32 bits constructions, wiring patterns for realizing the following constructions shall be registered.

|     | Memory 1         | Memory 2         |
| --- | ---------------- | ---------------- |
| (1) | 32 words × 4 bits  | 32 words × 28 bits |
| (2) | 32 words × 8 bits  | 32 words × 24 bits |
| (3) | 32 words × 12 bits | 32 words × 20 bits |
| (4) | 32 words × 16 bits | 32 words × 16 bits |
| (5) | 32 words × 20 bits | 32 words × 12 bits |
| (6) | 32 words × 24 bits | 32 words × 8 bits  |
| (7) | 32 words × 28 bits | 32 words × 4 bits  |

Another embodiment of the present invention in which four separate memories are formed from a memory cell matrix will be explained.

Figure 9:
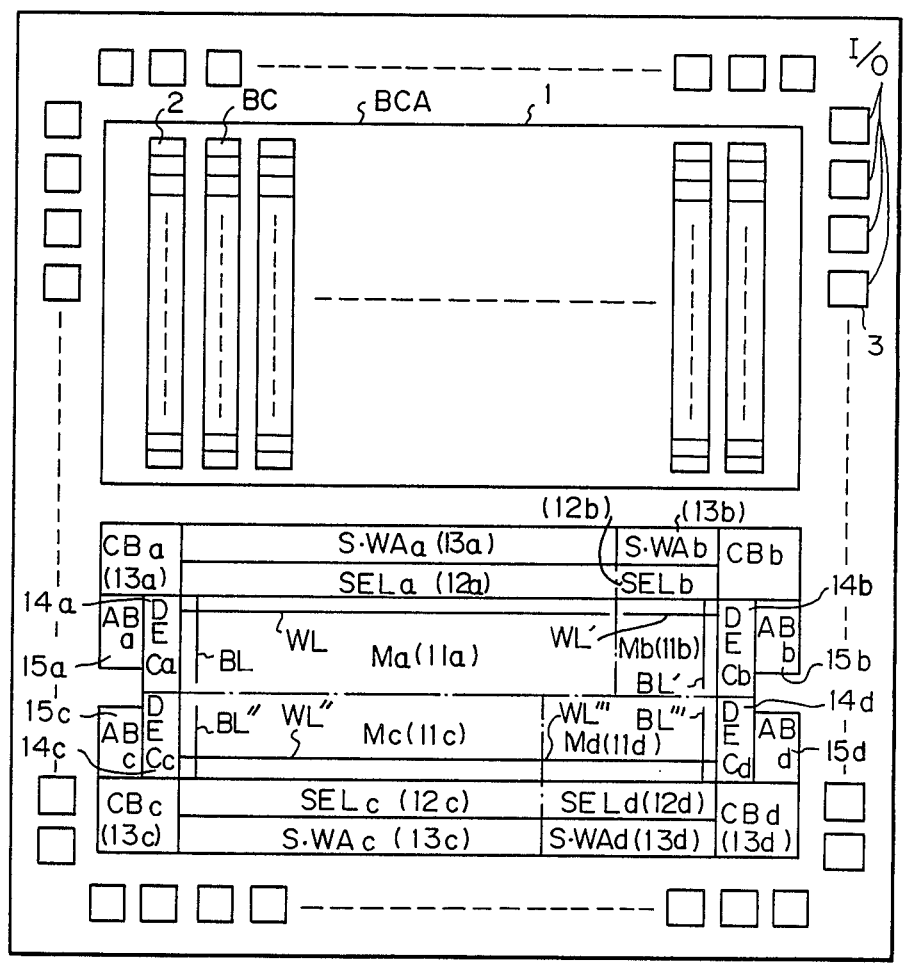
FIG. 9 is a plan view of another embodiment of the present invention.

FIG. 9 is a plan view of another embodiment of the present invention. In the figure, like numerals and designations used in FIG. 2 represent like parts. Only one word line and one bit line are shown for each memory cell matrix, other word and bit lines are omitted from the figure. This embodiment differs from the embodiment shown in FIG. 2 in that address registers $AB_c$ and $AB_d$, clock buffers $CB_c$ and $CB_d$, column selectors $SEL_c$ and $SEL_d$, and sense and write amplifiers $S.WA_c$ and $S.WA_d$ are added to the construction of FIG. 2. As a result, word lines are divided into WL and WL', or WL" and WL"', and bit lines also divided into BL and BL", or BL' and BL"' so that the memory cell matrix may be divided into four parts to form four independent memories. In FIG. 9, the combination of the word decoders $DEC_a$ (14a) and $DEC_c$ (14c) corresponds to $DEC_a$ (14a) of FIG. 2, and the combination of $DEC_b$ (14b) and $DEC_d$ (14d) corresponds to $DEC_b$ (14b) of FIG. 2. Supposing the basic memory cell matrix of the present embodiment comprises 32 words×32 bits, independent memories of 16 words×24 bits, 16 words×8 bits, 16 words×20 bits, and 16 words×12 bits are formed in FIG. 9.

Examples of memories realized by the construction shown in FIG. 9 will be described with reference to FIGS. 10 to 14.

Figure 10:
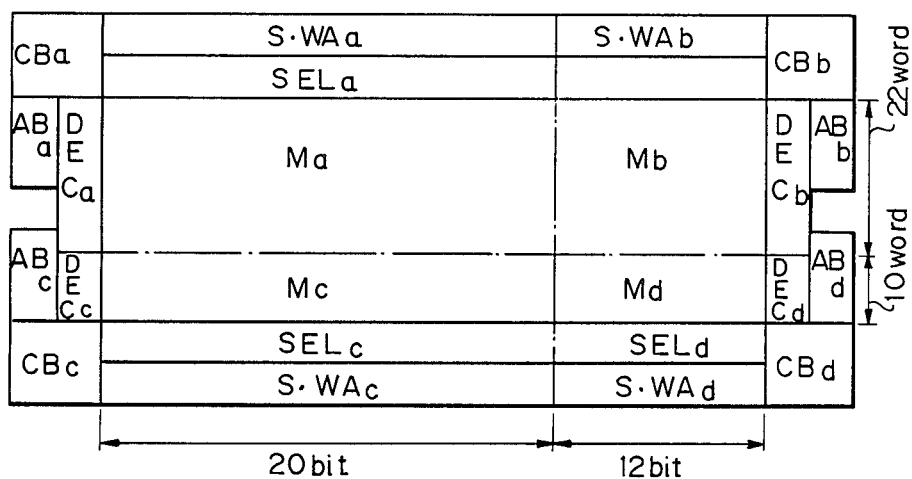
FIGS. 10 through 14 are diagrams of examples of bit/word constructions of memories realized according to the embodiment shown in FIG. 9.

FIG. 10 is an example in which memories of 22 words×20 bits, 22 words×12 bits, 10 words×20 bits, and 10 words×12 bits are constructed.

Figure 11:
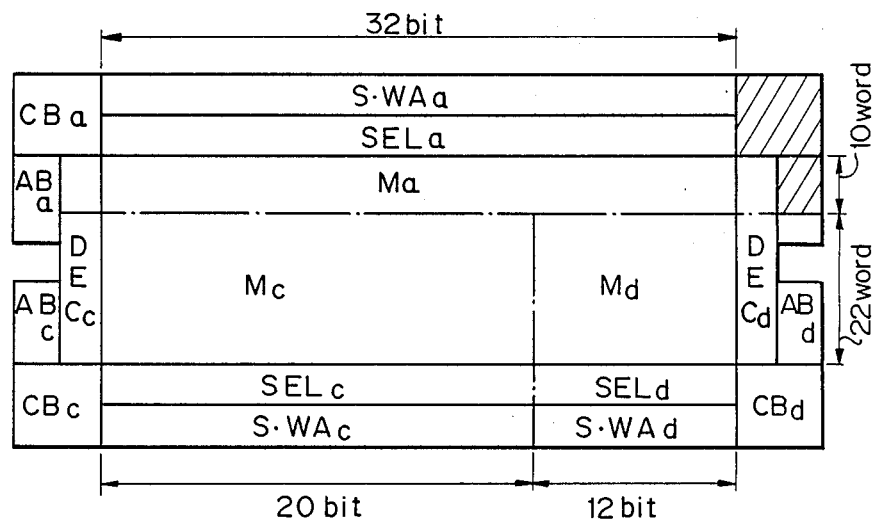

FIG. 11 is an example in which the word lines of memory cell matrix $M_a$ are not divided, and three memories of 10 words×32 bits, 22 words×20 bits, and 22 words×12 bits are constructed. In this case, the hatched clock buffer $CB_b$ and address register $AB_b$ are not used.

Figure 12:
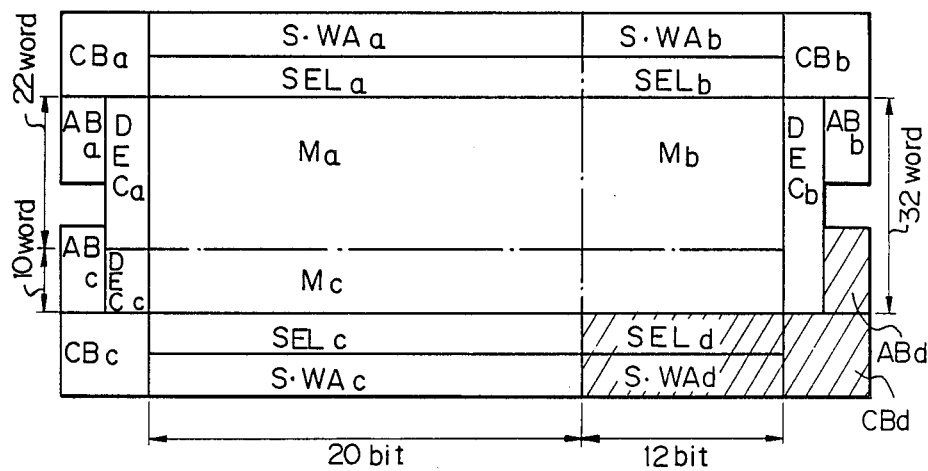

FIG. 12 is an example in which the bit lines of the memory cell matrix $M_b$ are not divided, and memories of 22 words×20 bits, 10 words×20 bits, and 32 words×12 bits are constructed. In this case, the clock buffer $CB_d$, column selector $SEL_d$, and sense and write amplifiers $S.WA_d$ are not used.

Figure 13:
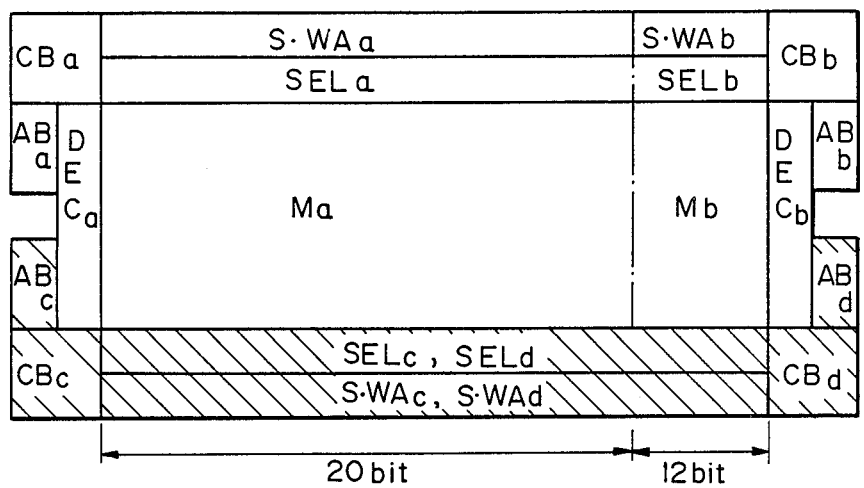

FIG. 13 is an example in which the clock buffers $CB_c$ and $CB_d$, column selectors $SEL_c$ and $SEL_d$, sense and write amplifiers $S.WA_c$ and $S.WA_d$, and address registers $AB_c$ and $AB_d$ are not used, and the memory cell matrix is divided in the same manner as that of the embodiment shown in FIG. 2.

Figure 14:
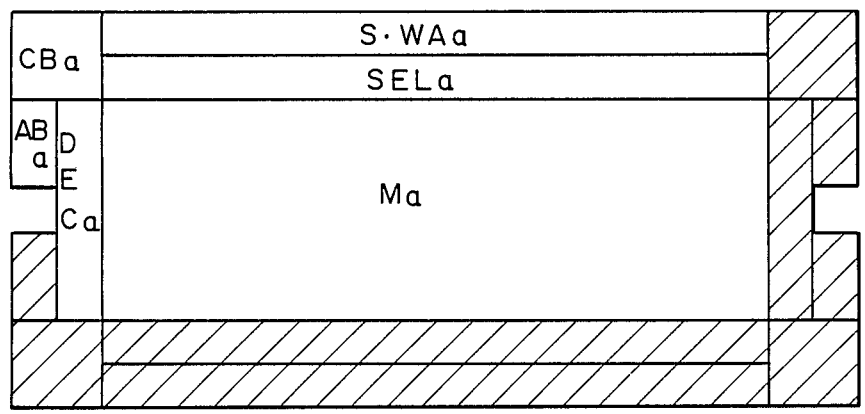

FIG. 14 is an example in which a single memory of 32 words×32 bits is used.

As mentioned above, four independent memories having different bit/word construction can be formed according to the embodiment shown in FIG. 9.

FIG. 15 is another embodiment of the present invention. The figure shows only the layout of a memory region portion. In this embodiment, there are provided two systems of address registers $AB_a$ and $AB_b$, clock buffers $CB_a$ and $CB_b$, column selectors $SEL_a$ and $SEL_b$, and sense and write amplifiers $S.WA_a$ and $S.WA_b$ to form two independent memories by dividing a bit line of the same column into BL and BL'. For instance, independent memories of 20 words×32 bits and 12 words×32 bits are realized.

Although the present invention has been explained with reference to the case in which a random access memory (RAM) is mounted on the gate array integrated circuit device, the present invention is also applicable to a case in which a read only memory (ROM) or a programmable logic array (PLA) is mounted on the gate array integrated circuit device.

Figure 16A:
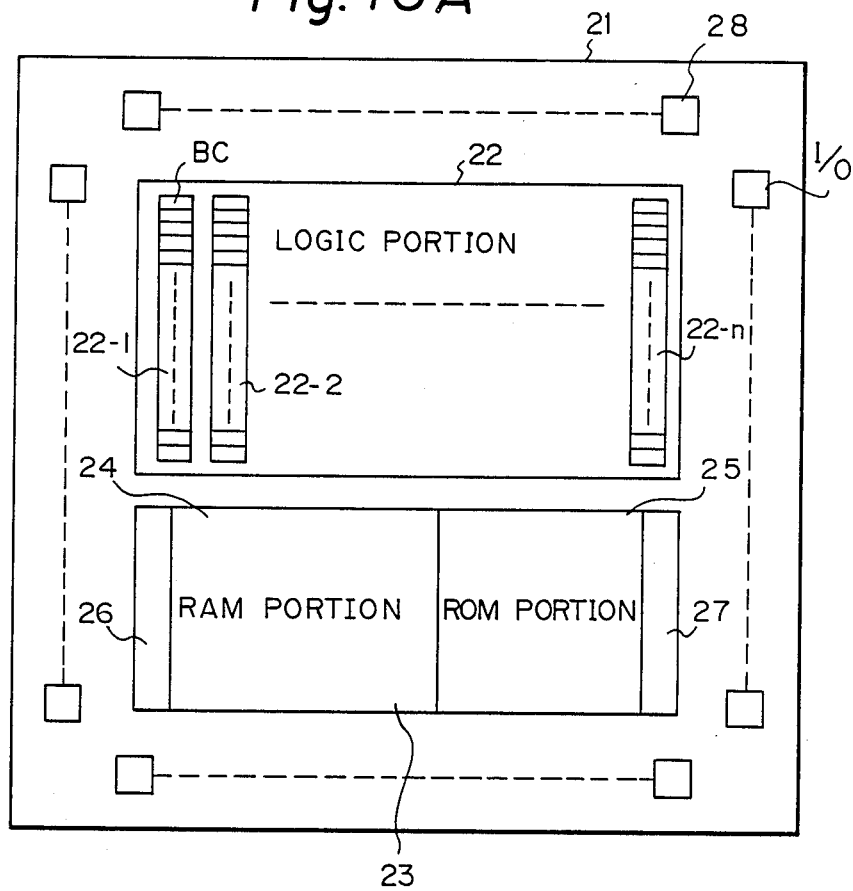

FIG. 16A is a further embodiment of the present invention, in which a random access memory (RAM) and a read only memory (ROM) are mounted on the device.

Figure 16B:
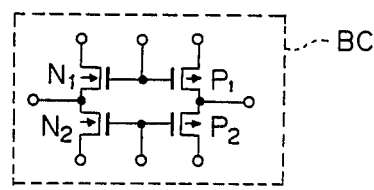

In FIG. 16A, 21 designates a chip, 22 is a logic portion, 22-1~22-n are basic cell arrays, 23 is a memory, 24 is a RAM portion, 25 is a ROM portion, 26 and 27 are peripheral circuits including an address register or row decoder etc., and 28 is an I/O (input/output) buffer portion. FIG. 16B is a basic cell BC. In FIG. 16B, $P_1$ and $P_2$ designate P channel MIS transistors, and $N_1$ and $N_2$ designate N channel MIS transistors.

In FIG. 16A, the logic portion 22 includes many basic cells BC, and the wiring patterns connecting these cells can be changed so that a logic circuit satisfying the requirement of a customer can be realized. Further, many basic cells as shown in FIG. 16B are previously formed on the substrate.

Figure 17:
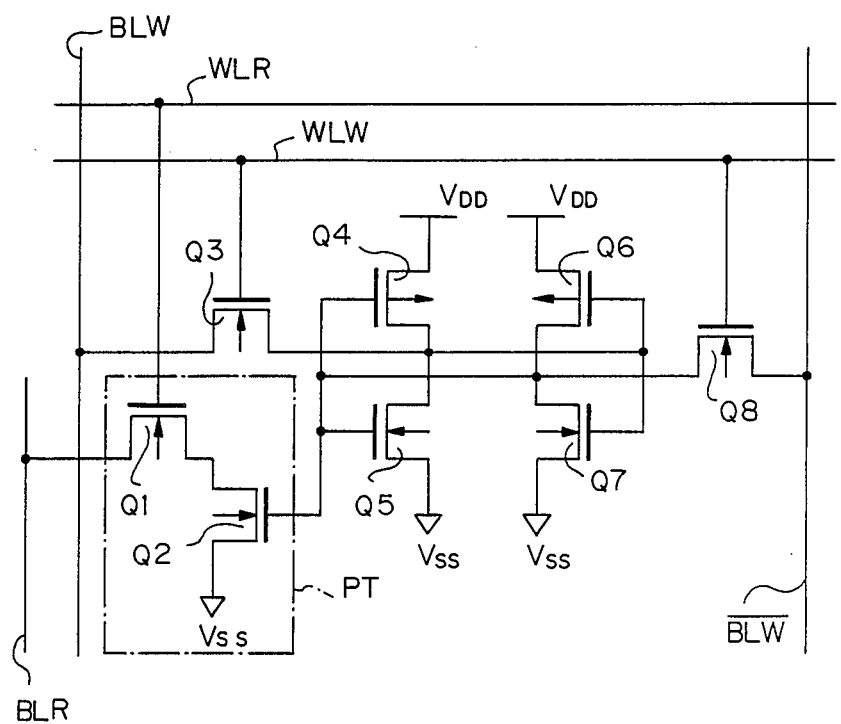
FIG. 17 is a circuit diagram of a circuit in the memory shown in FIG. 16C.

A bulk which can be used to construct a static type RAM array having at least one output port, and the wiring thereof, is suitably selected so that the required RAM or the ROM can be constructed. Further, the output may be constructed as dual-port or three port. FIG. 16c is a block diagram of the RAM and ROM portion of FIG. 16A. In FIG. 16A, 31 ($LD_1 \sim LD_n$) designates a bit line load unit and 32 ($MC_{11} \sim MC_{nm}$) designates a memory unit. The construction of the memory cell is shown in FIG. 17. That is, FIG. 17 is a circuit formed by the bulk which can be used to form a static type RAM array having at least one output port.

In FIG. 17, $Q_1$ to $Q_8$ designate transistors, (in which $Q_4$ and $Q_6$ are P channel MIS type transistor and the others are n channel MIS type transistors), WLR is a read word wire, BLR is a read bit wire, WLW is a writing word wire, BLW and $\overline{BLW}$ are write bit wires, and PT designates an output port.

In the memory shown in FIG. 17, the output port PT is formed by the transistors $Q_1$ and $Q_2$, and a latch circuit is formed by the transistors $Q_4$, $Q_5$, $Q_6$, and $Q_7$. The transistors $Q_3$ and $Q_8$ form a write gate.

The operation of the memory shown in FIG. 17 is well known, and therefore, only a summary of the operation will be given hereinafter.

The transistors $Q_3$ and $Q_8$ activated for writing the data in the latch circuit. The transistor $Q_2$ is made ON or OFF in accordance with the data held in the latch circuit.

When the data is read out, the read word line WLR is placed at a high (H) level, then the transistor $Q_1$ turns ON and the data held in the latch circuit is read out via the transistor $Q_2$ and output to the bit line BLR. When such a RAM is formed, all the transistors are wired.

Figure 18:
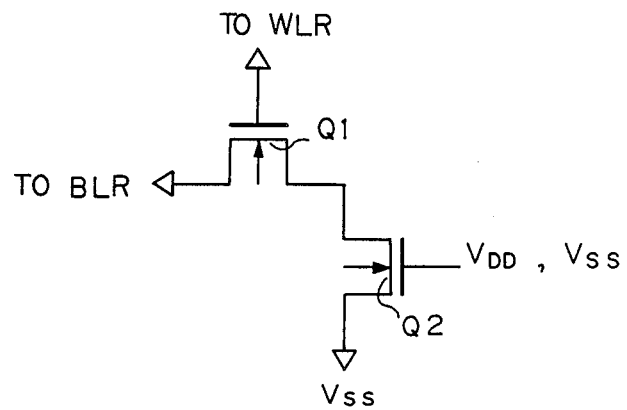
FIG. 18 is a circuit diagram of a circuit when the memory is formed as a read only memory.

FIG. 18 is a circuit where the ROM is formed by the bulk which can be used to form the RAM. In FIG. 18, the same symbols used in FIG. 17 designate the same portions or the same meanings as those in FIG. 17. In FIG. 18, $V_{DD}$ designates a positive side source level and $V_{SS}$ designates ground level.

When the ROM shown in FIG. 18 is formed from the bulk which can be used to form a RAM, as explained in FIG. 17, only the transistors $Q_1$ and $Q_2$ which form the port are connected as shown in FIG. 18 and the other transistors are not connected.

As shown in FIG. 18, the gate of the transistor $Q_2$ receives a positive side source voltage $V_{DD}$ or a ground side source voltage $V_{SS}$ so as to operate as a ROM.

Figure 19A:
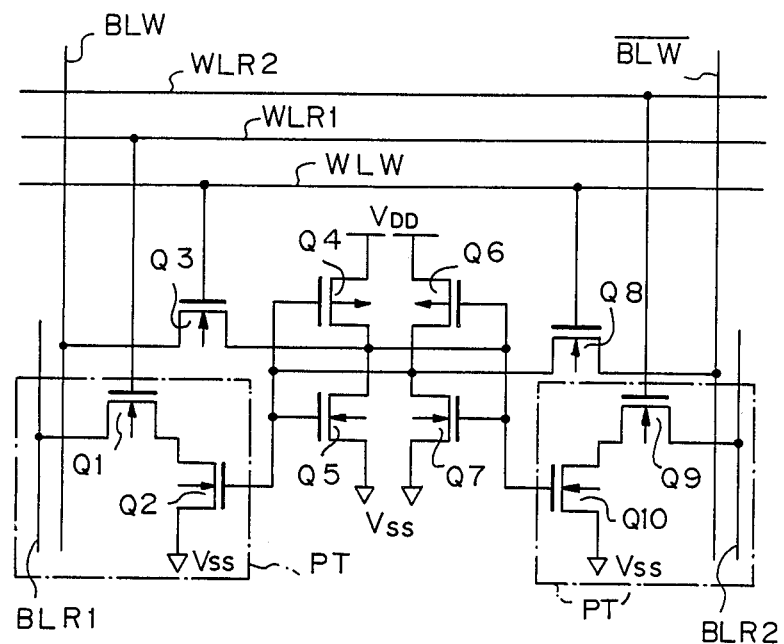
FIGS. 19A, 19B, 19C, and 19D are diagrams of a further embodiment of the present invention.

FIG. 19A is a circuit that is formed by using a bulk which can be used to form a static type RAM cell array having two ports, and the same symbols as used in FIGS. 17 and 18 show the same portions or have the same meanings as those in FIGS. 17 and 18.

In FIG. 19A, $Q_9$ and $Q_{10}$ designate transistors, PT and PT' are ports, $BLR_1$ and $BLR_2$ are read out bit wires, $WLR_1$ and $WLR_2$ are read out word wires.

In the memory shown in FIG. 19A, the transistors $Q_1$ and $Q_2$ form the port PT as shown in FIG. 17, and further, the port PT' formed by the transistors $Q_9$ and $Q_{10}$, is provided so that so called dual ports are formed.

In the memory shown in FIG. 19A, the connection for a ROM is made with the port PT' and the connection for a single port RAM is made which the other transistors, so that the device can be used as the memory cell of the ROM and the single port RAM. As seen from the connection shown in FIG. 19A, the output port PT' formed by the transistors $Q_9$ and $Q_{10}$ can read at the same time the data having an inverse polarity of the data which the output port PT, formed by the transistors $Q_1$ and $Q_2$ reads from the latch circuit.

Figure 19B:
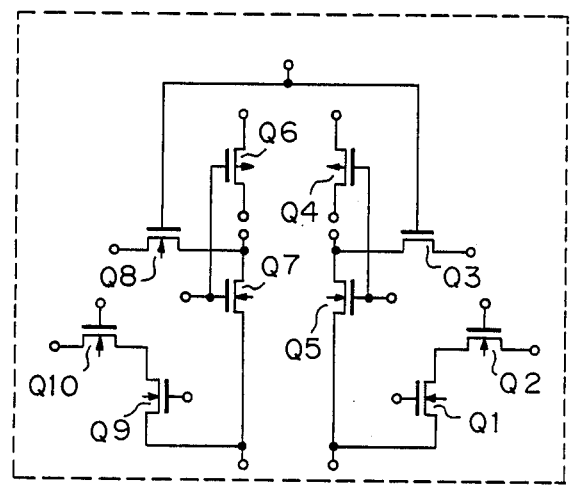
Figure 19C:
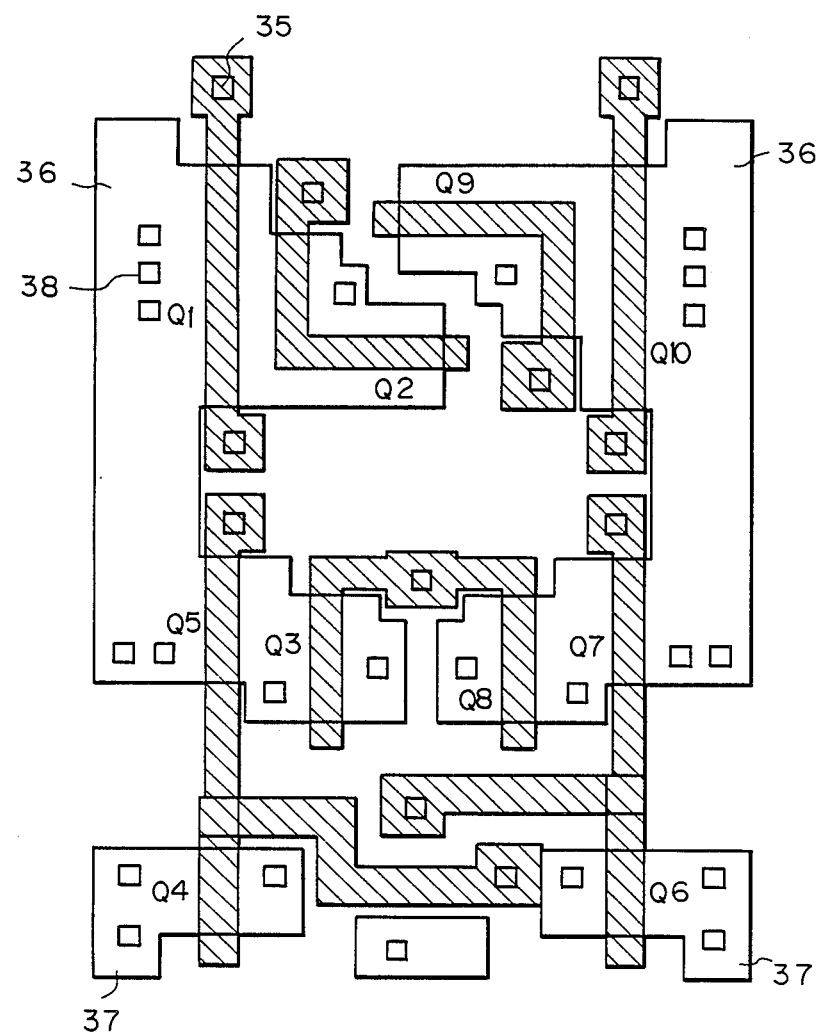

FIG. 19B shows a construction of the basic cell which forms a dual port static RAM cell and FIG. 19C shows a bulk pattern for the equivalent circuit shown in FIG. 19B. The metal wire connection on the pattern shown in FIG. 19C can be changed so that the dual port RAM, the single port RAM and ROM, or the ROM can be formed. In FIG. 19C, 35 designates a polysilicon gate, 36 an N+ diffusion layer (source-drain), 37 an P+ diffusion layer, and 38 a contact hole.

Figure 19D:
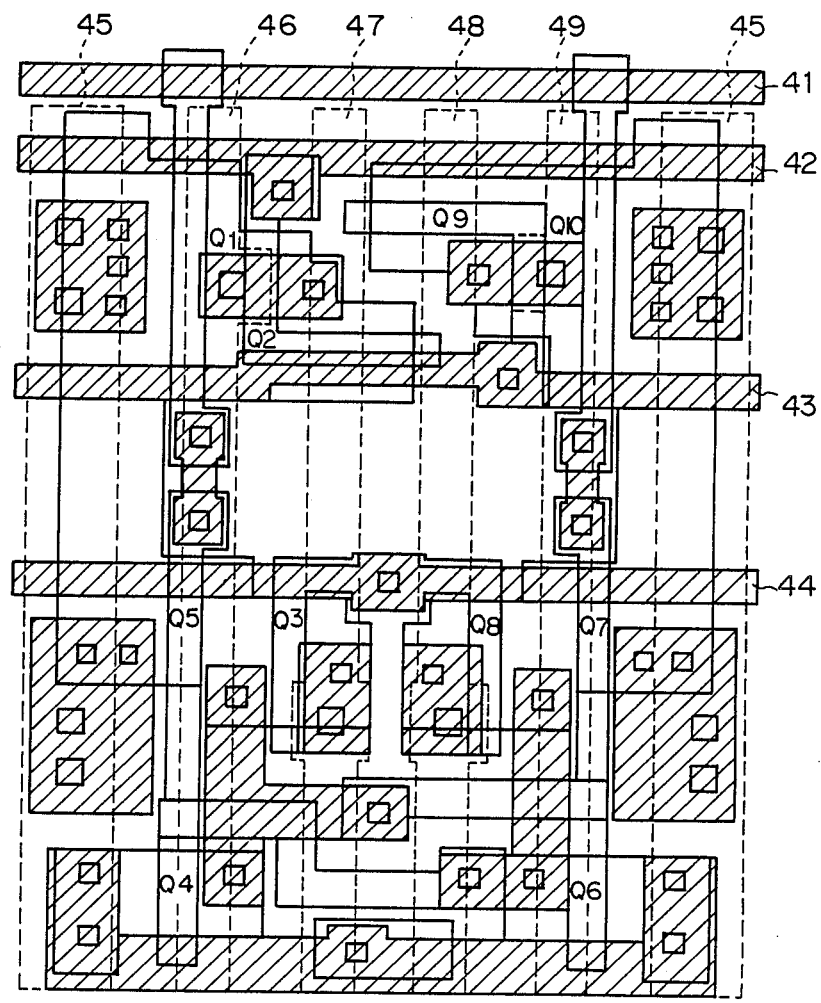

FIG. 19D shows a pattern which forms a memory cell shown in FIG. 19A by providing two layers of the metal wiring to the bulk pattern shown in FIG. 19C. In FIG. 19D, 41 is a power line, 42 is a read word line (on the destination side), 43 is a read word line (on the source side), 44 is a write word line, 45 is a ground line, 46 is a read bit line (on the destination side), 47 is a write bit line, 48 is a write bit line, and 49 is a read bit line (on the source side).

Figure 20:
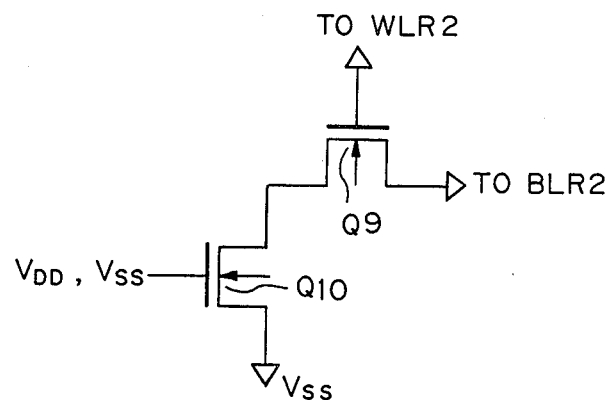
FIG. 20 is a circuit diagram of a circuit of still another embodiment of the present invention.

FIG. 20 is a circuit when the ROM is formed from the bulk which can be used to form a RAM as shown in FIG. 19A, and the same symbols used in FIGS. 18 and 19A show the same portions or have the same meanings as in FIGS. 18 and 19A.

When the ROM or the RAM shown in FIG. 20 is formed from the bulk shown in FIG. 19A, the transistors $Q_9$ and $Q_{10}$ which form the output port PT' are connected as shown in FIG. 20 so as to form a ROM, and the other transistors may be connected so as to form a six-transistor single port RAM.

Figure 21B:
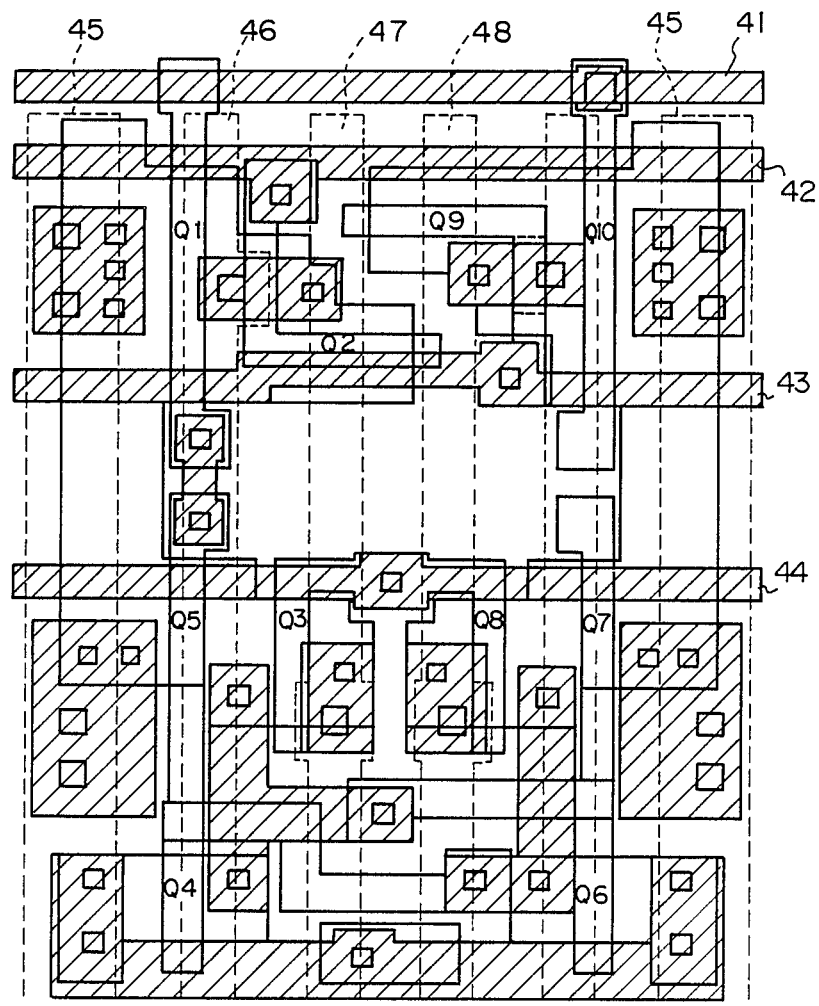
Figure 21C:
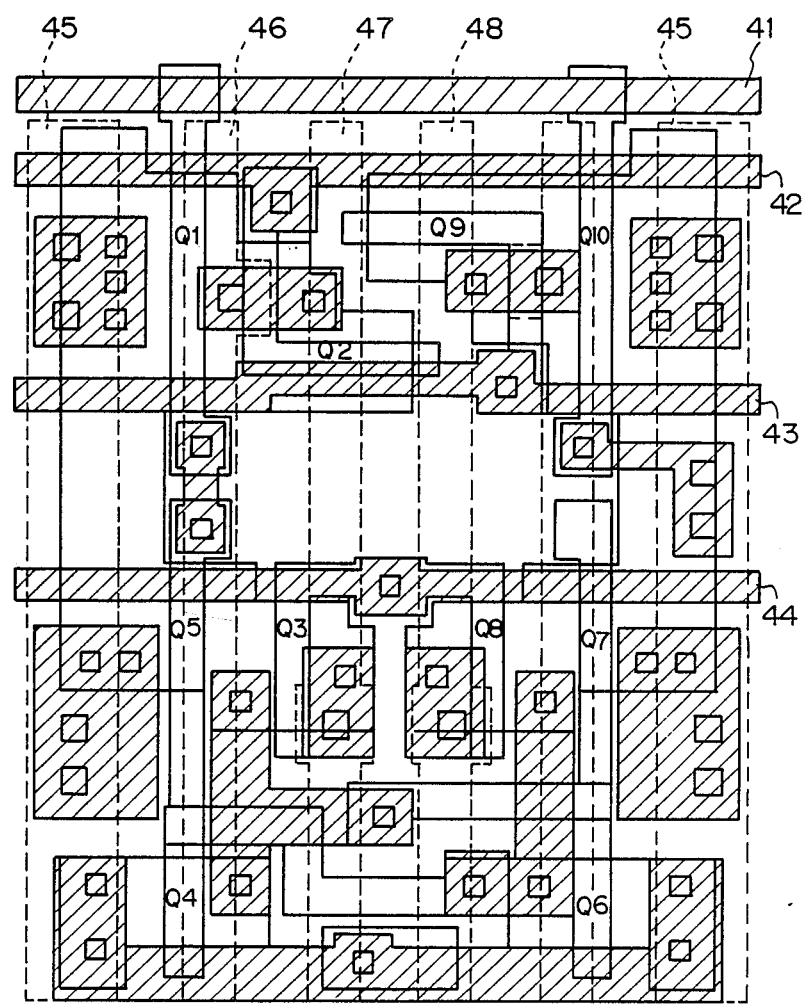

To access the single port RAM, the read word line $WLR_1$ on the destination side and the write word line WLW on the destination side may be used. FIG. 21A is a diagram of the circuit in which the transistors $Q_9$ and $Q_{10}$ are used as the ROM and the other transistors are used as the single port RAM. FIG. 21B is a pattern wherein the port RAM and ROM are formed by using the bulk pattern shown in FIG. 19C. FIG. 21B is a case wherein the gate of the transistor $Q_{10}$ is connected to $V_{DD}$. FIG. 21C is a pattern wherein the stored data in the ROM is the reverse of that shown in FIG. 21B. In FIG. 21B, the gate of the transistor $Q_{10}$ is connected to $V_{SS}$.

Figure 22:
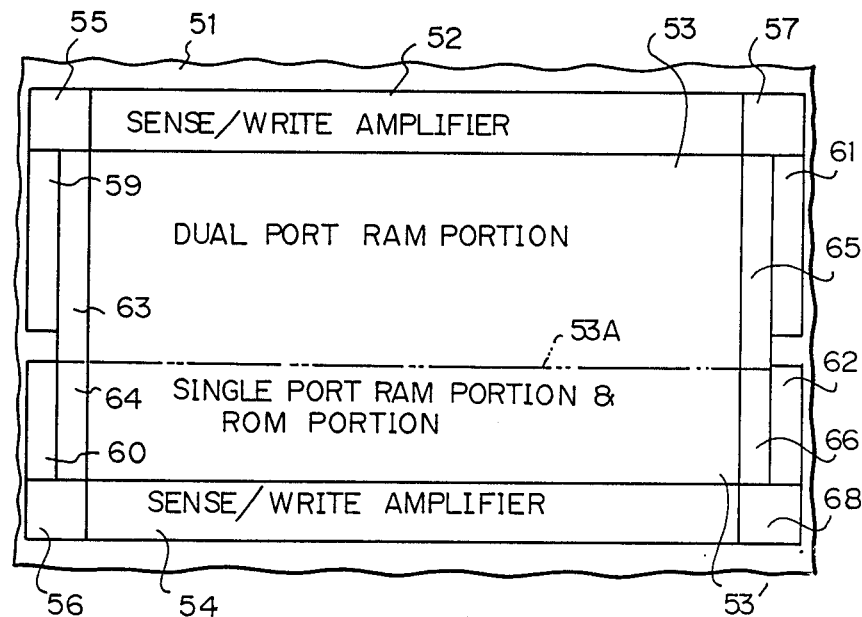
FIG. 22 is a diagram of the circuit of still another embodiment of the present invention.

FIG. 22 is a further embodiment of the present invention. In FIG. 22, 51 is a chip, 52 is a read and write amplifier used for a dual port RAM portion, 53 is a dual port RAM portion, 53' is a signal port RAM portion and ROM portion, 53A is a portion where the bit lines in the main cell region are disconnected, 54 is a read and write amplifier for the single port RAM portion and ROM portion, 55 is a clock buffer circuit on the destination side, 56 is a clock buffer circuit in the single port RAM, 57 is a clock buffer circuit on the source side, 58 is a clock buffer circuit in the ROM portion, 59 is an address register on the destination side, 60 is an address register for the RAM portion, 61 is an address register for the source side, 62 is an address register for the ROM portion, 63 is a row decoder on the destination side, 64 is a row decoder in the single port RAM, 65 is a row decoder on the source side, and 66 is a row decoder for the ROM portion.

The embodiment in FIG. 22 corresponds to the case where the bulk can be used to form the dual port RAM and is explained with reference to FIGS. 19A and 20.

Four address registers and four decoders are arranged peripherally to the memory, as shown in reference numerals 59, 60, 61, 62, and 63, 64, 65, 66. The memory is divided into the dual port RAM portion 53, the single port RAM portion and the ROM portion 53'. The bit lines in the memory are divided by the double-dot line 53A. The read and write amplifier 52 is used as an input and output device for the dual port RAM portion 53 and the read and write amplifier 54 is used as an input and output device for the signal port RAM portion and the ROM portion 53'. Further, in the single port RAM portion and the ROM portion 53', one bit of the dual port RAM is used as the single port RAM cell and the ROM cell.

The above-mentioned peripheral circuit, that is, the bulk of the address registers or the row decoders for the RAM portion, may be the same as that for the ROM portion. Further, it may be possible to decrease the region for the dual port RAM portion 53 and to increase the region for the signal port RAM portion and the ROM portion 53', or vice versa.

As described in the above, the present invention realizes the construction of a plurality of independent memories having bit/word constructions from a single memory cell array region. Accordingly, gate array integrated circuit devices having memories of different bit/word constructions may be produced according to a customer's requirement. If two independent memories are required, basic cells are not needed to form another memory, unlike conventional gate array integrated circuits which incorporate a memory region. As a result, the integration ratio of a circuit is increased, and effectiveness in circuit designing is improved.

We claim:

1. A gate array integrated circuit device comprising:
   a basic cell array region in which a plurality of basic cells are arranged;
   a rectangular memory cell matrix region in which a plurality of memory cells are arranged, said memory cell matrix region having first and second sides, the first side being opposite the second side, and having a third side; and
   a plurality of peripheral circuits each of which includes address input circuits and decoders for accessing said memory cells, including:
   first and second peripheral circuits arranged along the first and second sides of said rectangular memory cell matrix region, said peripheral circuits connected to at least tow independent memories, and each including:
   a clock buffer;
   a word decoder; and
   an address register; and
   a third peripheral circuit arranged along said third side of said rectangular memory cell matrix region and including:
   a column selector; and
   a sense amplifier.

2. A gate array integrated circuit device according to claim 1, wherein said plurality of memory cells are random access memories.

3. A gate array integrated circuit device according to claim 1, wherein said rectangular memory cell matrix region provides a bulk region, providing a plurality of transistors which form a static RAM and a ROM.

4. A method for producing a semiconductor device comprising the steps of:
   (a) forming, in advance, a semiconductor chip provided with a basic cell array region in which a plurality of basic cells are arranged, a rectangular memory cell matrix region in which a plurality of memory cells are arranged, and a plurality of peripheral circuits, formed along first and second sides of the periphery of the rectangular memory cell matrix, each of which includes address input circuits and decoders for accessing the memory cells;
   (b) connecting the basic cells to each other to form a predetermined logic circuit;
   (c) forming word lines in a first direction of the rectangular memory cell matrix region and forming bit lines in a second direction of the memory cell matrix region, the first direction being perpendicular to the second direction, according to a predetermined bit/word construction;
   (d) forming at least one of first and second groups of word lines and bit lines; and
   (e) connecting one of the groups of word lines and bit lines to each of the plurality of peripheral circuits, thereby forming at least two independent memories.

5. A gate array integrated circuit device comprising:
   a basic cell array region including basic cells;
   a rectangular memory cell matrix region, formed adjacent to said basic cell array region, including memory cells;
   peripheral circuits, formed along first and second sides of the periphery of said rectangular memory cell matrix region, the first and second sides being opposite each other, for accessing said memory cells, said peripheral circuits connected to at least two independent memories, and each including:
   a clock buffer;
   a word decoder; and
   an address register coupled to said clock buffer; and
   word lines, formed in said rectangular memory cell matrix region and divided into word line groups, said word line groups dividing said rectangular memory cell matrix region into at least two independent memories.

6. A method for producing a semiconductor device, comprising the steps of:
   (a) forming a semiconductor chip including a basic cell array region having basic cells, a rectangular memory cell matrix formed adjacent to the basic cell array region, and peripheral circuits formed along first and second sides of the periphery of the rectangular memory cell matrix;
   (b) connecting the basic cells for forming a predetermined logic circuit;
   (c) forming one of a group of word lines and bit lines in the rectangular memory cell matrix in accordance with a desired bit/word construction, the one of the group of word lines and bit lines being divided into at least two independent groups of word lines and bit lines; and
   (d) connecting the at least two independent groups of words lines and bit lines to at least two opposed peripheral circuits to form at least two independent memories.

7. A gate array integrated circuit device comprising:
   a basic cell array region in which a plurality of basic cells are arranged;
   a rectangular matrix region including a plurality of memory cells and having first and second sides which are orthogonal to each other;
   first and second peripheral circuits arranged along the first side of said rectangular matrix region and connected to at least two independent memories, and each including:
   a clock buffer;
   a word decoder coupled to said clock buffer; and
   an address register coupled to said clock buffer;
   a third peripheral circuit arranged along the second side of said rectangular matrix region and including:
   a column selector; and
   a sense amplifier.

* * * * *

UNITED STATES PATENT AND TRADEMARK OFFICE
CERTIFICATE OF CORRECTION

PATENT NO. : 4,791,607
DATED : DECEMBER 13, 1988
INVENTOR(S) : MASATO IGARASHI ET AL.

It is certified that error appears in the above-identified patent and that said Letters Patent is hereby corrected as shown below:

Col. 3, line 32, "represent" should be --represents--;

line 37, ""A'$_4$"" should be --"A'$_4$" represent--;

line 64, "$\overline{a_4}$" (first occurrence) should be --$a_4$--.

Col. 6, line 65, after "$Q_8$" insert --are--.

Col. 9, line 19, "tow" should be --two--.

Signed and Sealed this

Second Day of May, 1989

*Attest:*

DONALD J. QUIGG

*Attesting Officer*     *Commissioner of Patents and Trademarks*